United States Patent
Samuels et al.

(10) Patent No.: US 7,098,815 B1
(45) Date of Patent: Aug. 29, 2006

(54) METHOD AND APPARATUS FOR EFFICIENT COMPRESSION

(75) Inventors: Allen Samuels, San Jose, CA (US); Paul Sutter, San Francisco, CA (US); Robert Plamondon, Blodgett, OR (US)

(73) Assignee: Orbital Data Corporation, San Mateo, CA (US)

( * ) Notice: Subject to any disclaimer, the term of this patent is extended or adjusted under 35 U.S.C. 154(b) by 0 days.

(21) Appl. No.: 11/089,844

(22) Filed: Mar. 25, 2005

(51) Int. Cl.
 *H03M 7/34* (2006.01)
 *H03M 7/38* (2006.01)

(52) U.S. Cl. .......................... 341/51; 341/65; 341/67; 707/102; 707/204

(58) Field of Classification Search ................. 341/51; 707/102, 204
See application file for complete search history.

(56) References Cited

U.S. PATENT DOCUMENTS

| | | | |
|---|---|---|---|
| 5,745,900 A * | 4/1998 | Burrows ..................... | 707/102 |
| 5,778,395 A | 7/1998 | Whiting et al. | |
| 5,909,677 A | 6/1999 | Broder et al. | |
| 6,101,507 A | 8/2000 | Cane et al. | |
| 6,119,124 A * | 9/2000 | Broder et al. ........... | 707/103 R |
| 6,349,296 B1 * | 2/2002 | Broder et al. ................. | 707/3 |
| 6,611,213 B1 * | 8/2003 | Bentley et al. ............... | 341/51 |
| 6,658,423 B1 * | 12/2003 | Pugh et al. ................ | 707/102 |
| 6,667,700 B1 * | 12/2003 | McCanne et al. ............. | 341/51 |
| 2004/0174276 A1 | 9/2004 | McCane et al. | |

OTHER PUBLICATIONS

Spring, et al. "Protocol-Independent Technique Eliminating Redundant Network Traffic" available at http://www.cs.washington.edu/homes/djw/papers/spring-sigcomm00.pdf, 9 pages, unknown date.
Udi Manber, "Finding Similar Files in a Large File System", Oct. 1993, 11 pages.

* cited by examiner

*Primary Examiner*—Rexford Barnie
*Assistant Examiner*—Nguyen Khai
(74) *Attorney, Agent, or Firm*—Fernandez & Associates, LLP

(57) ABSTRACT

A compression method and apparatus identifying candidates for compression by selectively fingerprinting shingles or overlapping subsets of an input dataset and creating a set of characteristic input fingerprints based on fingerprint value. In some cases, the characteristic fingerprints are selected based on the relative value of the fingerprints with respect to other fingerprints in the same cluster. Potential matches may be identified and confirmed by comparing the characteristic input fingerprints with fingerprints associated with a history. Advantageously, some examples according to the current invention may be applied to input data such as: data, files, bit streams, byte streams, packet streams and previously encoded, compressed and/or encrypted data. In some cases, the number of fingerprints selected per cluster, the cluster size, the shingle size or shingle configuration, the size or configuration of the overlap between successive shingles, and the configuration for adding entries to a history, may be adaptively configurable.

22 Claims, 6 Drawing Sheets

| First Element in Shingle | Shingles | Finger-prints | Selected Fingerprints based on largest relative value | Selected Fingerprints based on smallest relative value | |
|---|---|---|---|---|---|
| b | brev | 0.03329 | 0.40364 | 0.03329 | } cluster |
| r | revi | 0.34414 | | | |
| e | evit | 0.40364 | | | |
| v | vity | 0.27637 | 0.73007 | 0.27637 | |
| i | ity_ | 0.73007 | | | |
| t | ty_I | 0.6004 | | | |
| y | y_is | 0.77705 | 0.77705 | 0.51304 | |
| _ | _is_ | 0.51304 | | | 411 |
| i | is_t | 0.56433 | | | |
| s | s_th | 0.24248 | 0.50935 | 0.24248 | 401 |
| _ | _the | 0.5025 | | | |
| t | the_ | 0.50935 | | | |
| h | he_s | 0.33594 | 0.33594 | 0.0997 | 412 402 |
| e | e_so | 0.0997 | | | |
| _ | _sou | 0.2746 | | | 403 |
| s | soul | 0.26495 | 0.39926 | 0.26495 | 413 |
| o | oul_ | 0.36422 | | | |
| u | ul_o | 0.39926 | | | 404 |
| l | l_of | 0.15153 | 0.70186 | 0.15153 | 414 |
| _ | _of_ | 0.70186 | | | |
| o | of_w | 0.43443 | | | |
| f | f_wi | 0.98098 | 0.98098 | 0.24099 | |
| _ | _wit | 0.24099 | | | |
| w | wit. | 0.28816 | | | |
| i | it.# | 0.22595 | 0.28174 | 0.15834 | |
| t | t.## | 0.28174 | | | |
| . | .### | 0.15834 | | | |

Selectively Fingerprinted String of Characters

An input dataset is selectively fingerprinted, creating a set of characteristic input fingerprints (Step 100).

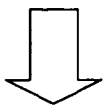

A search is done for matches between fingerprints in the set of characteristic input fingerprints and fingerprints associated with a second selectively fingerprinted dataset (Step 110).

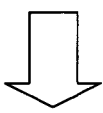

Optionally, exact matches of overlapping subsets are confirmed (Step 120).

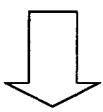

Optionally, matches may be extended to create longer matches (Step 130).

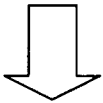

A compression operation is executed on the input dataset (Step 140).

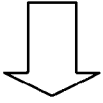

Optionally, incorporate information associated with unmatched overlapping subsets from the input dataset into the second selectively fingerprinted dataset (Step 150).

Figure 1

Receive input data set (Step 300a).
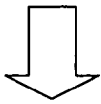
Segment the input data set into shingles (Step 310a).
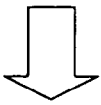
Fingerprint shingles (Step 320a).
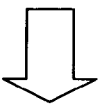
Cluster fingerprints (Step 330a).
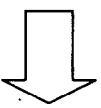
Select at least one fingerprint from each cluster based on the relative value of the fingerprint and add this fingerprint to the set of characteristic input fingerprints (Step 340a).
Figure 2a

| Selectively Fingerprinted String of Characters | | | | |
|---|---|---|---|---|
| First Element in Shingle | Shingles | Finger-prints | Selected Fingerprints based on largest relative value | Selected Fingerprints based on smallest relative value |
| b | brev | 0.03329 | 0.40364 | 0.03329 |
| r | revi | 0.34414 | | |
| e | evit | 0.40364 | | |
| v | vity | 0.27637 | 0.73007 | 0.27637 |
| I | ity_ | 0.73007 | | |
| t | ty_I | 0.6004 | | |
| y | y_is | 0.77705 | 0.77705 | 0.51304 |
| _ | _is_ | 0.51304 | | |
| i | is_t | 0.56433 | | |
| s | s_th | 0.24248 | 0.50935 | 0.24248 |
| _ | _the | 0.5025 | | |
| t | the_ | 0.50935 | | |
| h | he_s | 0.33594 | 0.33594 | 0.0997 |
| e | e_so | 0.0997 | | |
| _ | _sou | 0.2746 | | |
| s | soul | 0.26495 | 0.39926 | 0.26495 |
| o | oul_ | 0.36422 | | |
| u | ul_o | 0.39926 | | |
| l | l_of | 0.15153 | 0.70186 | 0.15153 |
| _ | _of_ | 0.70186 | | |
| o | of_w | 0.43443 | | |
| f | f_wi | 0.98098 | 0.98098 | 0.24099 |
| _ | _wit | 0.24099 | | |
| w | wit. | 0.28816 | | |
| i | it.# | 0.22595 | 0.28174 | 0.15834 |
| t | t.## | 0.28174 | | |
| . | .### | 0.15834 | | |

Figure 3a

| Selectively Fingerprinted Segment of History |||||
|---|---|---|---|---|
| First Element in Shingle | Shingles | Finger-prints | Selected Fingerprints based on largest relative value | Selected Fingerprints based on smallest relative value |
| t | the | 0.50935 | 0.50935 | 0.0997 |
| h | he_s | 0.33594 | | |
| e | e_so | 0.0997 | | |
| | sou | 0.2746 | 0.36422 | 0.26495 |
| s | soul | 0.26495 | | |
| o | oul | 0.36422 | | |
| u | ul_o | 0.39926 | 0.70186 | 0.15153 |
| l | l_of | 0.15153 | | |
| | of_ | 0.70186 | | |
| o | of_a | 0.2912 | 0.769 | 0.2912 |
| f | f_a | 0.769 | | |
| | _a_n | 0.62036 | | |
| a | a_ne | 0.27394 | 0.82589 | 0.27394 |
| | new | 0.82589 | | |
| n | new_ | 0.82045 | | |
| e | ew_m | 0.46885 | 0.68842 | 0.13912 |
| w | w_ma | 0.13912 | | |
| | mac | 0.68842 | | |
| m | mach | 0.39125 | 0.39125 | 0.23981 |
| a | achi | 0.34723 | | |
| c | chin | 0.23981 | | |
| h | hine | 0.96324 | 0.96324 | 0.15413 |
| i | ine. | 0.15413 | | |
| n | ne.# | 0.46663 | | |
| e | e.## | 0.14873 | 0.32613 | 0.14873 |
| . | .### | 0.32613 | | |
| t | the_ | 0.50935 | 0.50935 | |

Figure 3b

METHOD AND APPARATUS FOR EFFICIENT COMPRESSION

BACKGROUND

1. Field

The present invention relates generally to data compression and more specifically to efficient identification of compressible segments.

2. Related Art

Compression techniques may be used in conjunction with a variety of important application areas. For example, compression techniques may be used to improve speed and/or functionality and/or reduce hardware and/or networking requirements in a variety of application areas such as, but not limited to: storage, back-up and network traffic reduction. However, applying a compression technique may incur costs by introducing a time delay, absorbing computing cycles and/or requiring additional hardware.

Many compression techniques require the identification of matches between an input dataset or dataset segment and an entry in a dictionary or a portion of data history using a substring search mechanism. In some substring search mechanisms, identification of matches may be done using a selective fingerprinting technique for identifying a characteristic set of fingerprints for representing an input dataset. However, according to some selective fingerprinting implementations, unaligned matches may be missed if the fingerprints are selected strictly based on spatial distribution with respect to the input dataset. Selecting a characteristic set of fingerprints based only on the value of the fingerprint may provide a set of characteristic fingerprints which are probabilistically distributed but not necessarily spatially distributed, sometimes leading to unpredictable and/or large missed matches. What is needed is a compression technique capable of efficiently locating matches between an input dataset and a dictionary or history.

SUMMARY

According to the current invention, a compression technique identifies candidates for compression by selectively fingerprinting shingles or overlapping subsets of the input dataset and creating a set of characteristic input fingerprints based on fingerprint value per cluster of shingles. By comparing the characteristic input fingerprints with fingerprints associated with a history or dictionary, potential matches may be identified and subsequently confirmed. This results in an efficient technique for identifying matches using a characteristic set of input fingerprints which are spatially distributed with respect to the input dataset. In some cases, fingerprints may be de-referenced to identify their related shingles and actual matches may be confirmed by comparing the actual shingles of input data with the actual history or dictionary subsets. In some cases, the efficiency and/or effectiveness of the method may be configured by designating the size or configuration of the shingles, the size or configuration of the overlap between successive shingles and/or the size of the cluster.

In some examples of the current invention, the set of characteristic input fingerprints are identified by selecting one fingerprint from each cluster of shingles based on the relative value of the fingerprint compared to other fingerprints in the cluster. For example, the fingerprint with the greatest value may be selected per cluster. In some cases, other criteria may be used such as, but not limited to, identifying the fingerprint with the smallest value per cluster. In other examples, more than one fingerprint may be selected per cluster.

In some examples according to the current invention, the size or configuration of the overlap between successive shingles is a small increment. The input data set comprises a set of elements such as, but not limited to bits, bytes, words, characters, lexical elements and packets. The size of the overlap between successive shingles may be the size of a single element such as, but not limited to, a single character, a single lexical element or a single bit. In other examples, the size of the overlap between successive shingles may be much larger, for example, the size of the overlap between successive shingles may be equal to the size of a shingle minus a single element. By using a small cluster size, a large overlap between successive shingles and a small shingle size, the maximum size of a missed match may be minimized. In some cases, an alignment independent configuration may be enabled by making the size or configuration or configuration of the overlap between successive shingles equal to the size of a shingle minus a single element. In some cases, the size or configuration of the overlap between successive shingles, the size or configuration of the shingle, the number of fingerprints selected per cluster and/or the size of the cluster may be optimized for various operational conditions and/or objectives.

In some examples according to the current invention, confirmed matches may be extended to create longer matches. In some cases, multiple confirmed matches may be combined to form a single larger confirmed match before the compression operation is executed.

In some examples according to the current invention, the clusters of shingles may comprise as few as two shingles. However, in other examples, the clusters may be much larger. The clusters enable the generation of sets of fingerprints from sets of successive shingles. For example, in some cases, the shingles may be clustered and then fingerprinted; in some cases, the shingles may be fingerprinted and the resulting fingerprints may be clustered. In some cases, the clusters comprise a uniform number of elements and/or are of uniform size per input dataset. However, in other examples, the number or elements per cluster and/or the size of the cluster may vary across the input dataset.

In some examples according to the current invention, the fingerprinting algorithm may be a one-way hash function creating non-unique indices into a hash table. However, in other examples according to the current invention, the fingerprinting algorithm may produce unique or non-unique indices into a variety of other data structures such as, but not limited to: associative arrays, tables, trees and databases.

In some examples according to the current invention, new entries may be added to the history or dictionary when unique shingles are identified.

Advantageously, some examples according to the current invention may be applied to any type of input data such as, but not limited to: data, files, bit streams, byte streams, packet streams and previously encoded and/or compressed data. In some cases, the current invention may be applied to encrypted data. In some cases, parameters such as, but not limited to: the number of fingerprints selected per cluster, the cluster size, the shingle size or shingle configuration, the size or configuration of the overlap between successive shingles, and the configuration for adding entries to a dictionary or history, may be statically, dynamically, automatically and/or adaptively configurable.

BRIEF DESCRIPTION OF DRAWINGS

FIG. 1 illustrates an example method according to the current invention for compressing a dataset.

FIGS. 2a and 2b illustrate example processes for producing a selectively fingerprinted dataset.

FIG. 3a illustrates an example of a selectively fingerprinted string of characters.

FIG. 3b illustrates an example of a selectively fingerprinted segment of history.

DETAILED DESCRIPTION

FIG. 1 illustrates an example method according to the current invention for compressing a dataset. The process begins when an input dataset is selectively fingerprinted, creating a set of characteristic input fingerprints (Step 100). The input dataset comprises a set of elements such as, but not limited to: characters, bits, bytes, words, lexical elements and packets. The elements may or may not be the same size across an input dataset. Examples of input datasets include, but are not limited to: data, text, streams, bit streams, byte streams, packet streams and previously encoded and/or compressed data. For example, the input dataset may represent anything such as, but not limited to encoded, compressed, encrypted and/or unprocessed dataflows, files and/or network traffic.

Figure 2B:
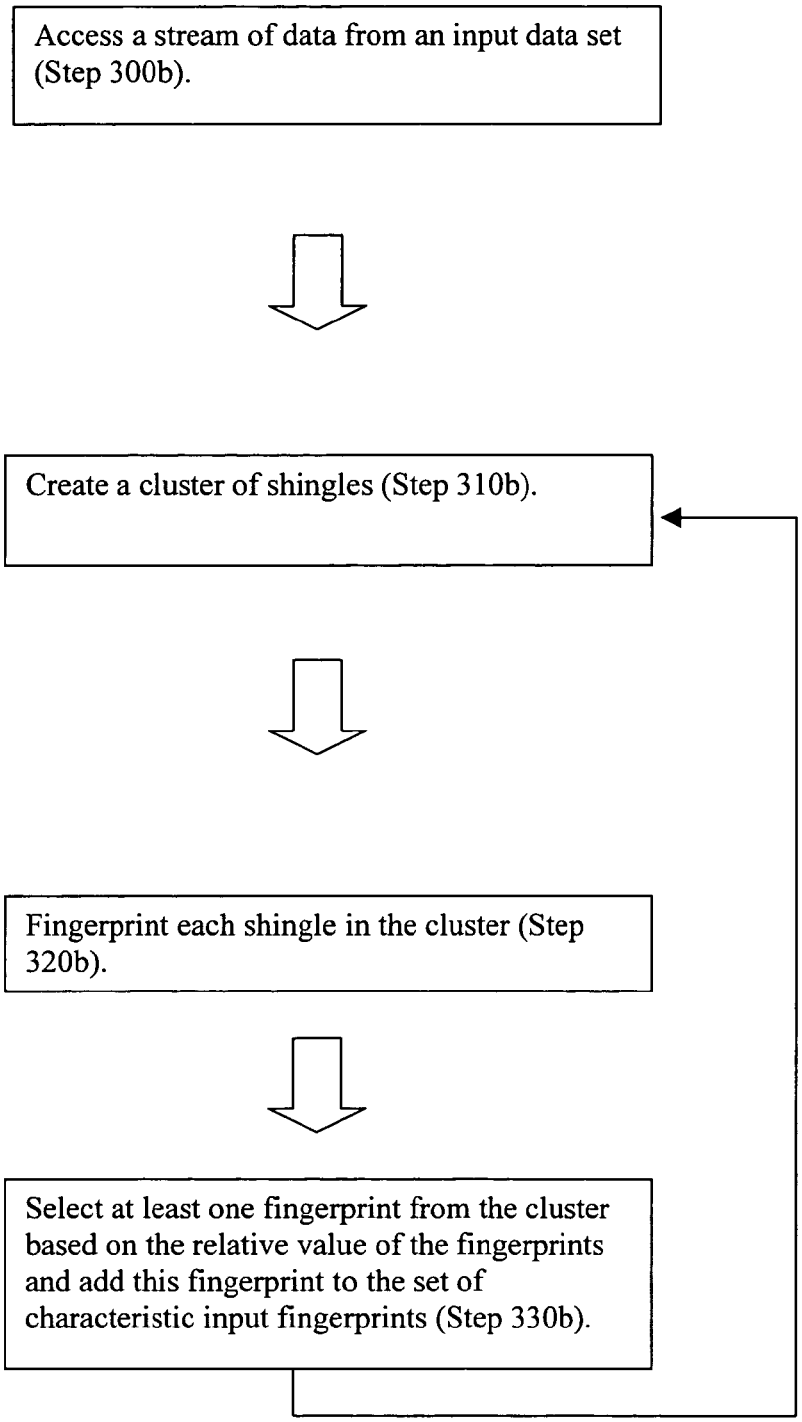

FIGS. 2a and 2b illustrate example processes for producing a selectively fingerprinted dataset. According to the current invention, in selective fingerprinting, shingles (overlapping subsets of the input dataset) are established, fingerprinted and clustered; one or more input fingerprints are selected from each cluster, creating a set of characteristic input fingerprints. The clustering enables the grouping of sets of fingerprints from successive shingles into clusters of fingerprints. According to the current invention, the step of clustering may be rearranged with respect to other steps. For example, in some cases, the step of clustering may comprise grouping shingles which may then be fingerprinted, thereby creating a cluster of fingerprints; in some cases, the shingles may be fingerprinted and the resulting fingerprints may be clustered into clusters of fingerprints.

A variety of selective fingerprinting processes according to the current invention are envisioned. The shingle size and/or configuration, the size of the overlap between successive shingles, the number of fingerprints selected per cluster and/or the size of the clusters may or may not be held constant across an input data. In some cases, configuring the shingle size and/or shingle configuration, the cluster size, the number of fingerprints selected per cluster and the size of overlap between successive shingles may be optimized for various operational conditions and/or objectives.

According to the current invention, fingerprints provide an index or key to access a representation of a shingle. For example, in some cases, a fingerprint may be generated by applying a hash function to a shingle, thereby creating an index into a hash table for retrieving the shingle. According to the current invention, the index may be unique or non-unique. In some cases where the index is not unique, techniques for handling collisions may be implemented. For example, collision handling techniques may become important when the second dataset, possibly representing a history or dictionary, becomes very large. According to the current invention, when implementing a fingerprinting algorithm, other unique and/or non-unique indices and/or keys may be used in conjunction with other data structures such as, but not limited to: associative arrays, trees and databases.

When selectively fingerprinting an input dataset, a subset of the fingerprints from the shingles are selected, creating a characteristic set of input fingerprints. According to the current invention, at least one fingerprint is selected per cluster based on the value of the fingerprint. In some examples according to the current invention, at least one fingerprint is selected per cluster based, at least in part, on the relative value of the fingerprint with respect to other fingerprints in the same cluster. A variety of selection criteria may be used such as, but not limited to, selecting the smallest or largest fingerprint per cluster. In some cases, more than one fingerprint may be chosen per cluster. The following examples illustrate possible fingerprint selection criteria for selecting two fingerprints per cluster: the two largest fingerprints may be selected; the largest fingerprint and the smallest fingerprint may be selected; the largest fingerprint and the last fingerprint may be selected; and, the largest fingerprint and the third fingerprint may be selected. Selecting at least one fingerprint per cluster insures a spatial distribution of fingerprints across an input dataset when an input dataset is much larger than the shingle size. Furthermore, selecting at least one fingerprint per cluster based on its value with respect to other fingerprints in the same cluster can provide good spatial distribution of fingerprints across a dataset even when the dataset is not much larger than the shingle size. In some cases and configurations, this technique can be effective for finding matches, even when the input dataset is not aligned with respect to the dictionary or history.

FIG. 3a illustrates an example of a selectively fingerprinted string of characters. FIG. 3b illustrates an example of a selectively fingerprinted segment of history. In this example, the input dataset is a string of text: "brevity is the soul of wit." and the history (a second selectively fingerprinted dataset) contains a string of text: "the soul of a new machine." In this example, the size and configuration of each shingle, the number of fingerprints selected per cluster, the size of overlap between successive shingles and the size of the clusters are kept constant across the input dataset and across the history; the input dataset and the history dataset comprise sets of single-character elements; the shingle configuration is based on collections of four single-character elements leading to a shingle size of four characters, the overlap size is a three elements (corresponding to three characters in this configuration) and the clusters comprise three adjacent fingerprints. In this example, two different fingerprinting selection criteria are illustrated. Each table contains one column showing the set of selected fingerprints based on selecting the single largest fingerprint per cluster and another column showing the set of selected fingerprints based on selecting the smallest fingerprint per cluster. In this example, fingerprinting was achieved by applying a hash function to a byte representation of each shingle, thereby creating a non-unique hash value for each shingle.

The process continues when a search is done for matches between fingerprints in the set of characteristic input fingerprints and fingerprints associated with a second selectively fingerprinted dataset (Step 10). For example, the second selectively fingerprinted dataset may be a history and/or dictionary. Referring to the example illustrated in FIGS. 3a and 3b, when the set of characteristic input fingerprints are selected based on the largest relative value per cluster, a match may be identified between fingerprints 411 and 431, both with a fingerprint value of 0.59035. Similarly, when the set of characteristic input fingerprints are selected based on the smallest relative value per cluster, a matches may be identified between fingerprints 412 and 432 (both with a fingerprint value of 0.0997), fingerprints 413 and 433 (both with a fingerprint value of 0.26495) and fingerprints 414 and 434 (both with a fingerprint value of 0.15153). In some cases, such as situations where round-off errors may occur in fingerprint computation, a near match between two fingerprints may be considered a match.

The first and second selectively fingerprinted datasets may or may not be selectively fingerprinted according to the same methods. In some examples, the size of the overlap between successive shingles and/or the cluster size may or may not be the same for the first and second selectively fingerprinted datasets. According to the current invention, exact matches between subsets of the first and second selectively fingerprinted datasets are based on fingerprints derived from the same shingle configuration. For example, if an input dataset is fingerprinted using a shingle size of five characters, all identified exact subset matches in the second dataset will be associated with fingerprints based on shingles with five elements per shingle.

In some cases, a shingle may comprise elements of varying size. For example, lexical elements may vary in size. If an "English word" is used as an element and the current invention is configured to search and compress based on sequences of identical English words, shingles may be configured to comprise a fixed number of English words. However, English words are not all the same size. For example, the current invention may be configured to operate based on four English words per shingle; in this configuration, each shingle may have the same configuration, but shingles may vary in absolute size. Similarly, the configuration of the overlap between successive shingles may be three English words; in this case, the configuration of the overlap between successive shingles may be consistent across the input dataset, however the overlap may vary in absolute size. In this English word based example, configuring a small shingle size and a large overlap between successive shingles may enable the effective identification of sets of identically matching strings of English words. In this example, sensitivity to misalignment between the first selectively fingerprinted dataset and the second selectively fingerprinted dataset may be minimized by using an overlap configuration of three English words which is equal to the size of the shingle (four English words) minus a single element (one English word). In order to effectively identify matches, at least some portion of the second selectively fingerprinted dataset must be fingerprinted based on the same shingle configuration as the first selectively fingerprinted dataset; in this example, the shingle configuration is based on an "English word" element with shingles comprising four English words.

In some cases, selective fingerprinting parameters-such as, but not limited to, the shingle size and/or configuration, the cluster size, the number of fingerprints selected per cluster and the size of the overlap between successive shingles may be statically, dynamically, automatically and/or adaptively configurable for the input dataset and/or the second selectively fingerprinted dataset. For example, in a case where the second selectively fingerprinted dataset grows over time, a second selectively fingerprinted dataset may start out small and a large number of fingerprints may be selected from each cluster; as the second selectively fingerprinted dataset grows, fewer fingerprints may be selected from each cluster. For example, in some cases, the number of fingerprints selected from the second selectively fingerprinted database may be configured and/or be adaptable based on one or more criteria such as, but not limited to, static and/or dynamic considerations such as the availability of processing and/or memory resources on a computer and compression speed considerations.

Optionally, the process continues when exact matches of shingles are confirmed (Step 120). Each fingerprint may be de-referenced to identify its related shingle so exact matches between the first and second datasets may be confirmed. This step may be especially important when used in conjunction with fingerprinting algorithms which produce non-unique keys or indices. For example, referring to the example illustrated in FIGS. 3a and 3b wherein fingerprints are selected based on the largest relative value per cluster, fingerprint 411 may be de-referenced to identify its related shingle 401 ("the_"); fingerprint 431 may be de-referenced to identify its related shingle 421 ("the_") and the exact match between the two shingles may be confirmed. However, in some cases, step 120 may not be necessary. For example, if the fingerprinting algorithm produces unique keys or indices, no confirmation may be required.

Optionally, in some examples according to the current invention, matches may be extended to create longer matches (Step 130). For example, a match may be extended from the beginning and/or end of the subset. In some cases, multiple matches may be combined to form a single larger match before the compression operation is executed. Conventional and non-conventional techniques may be used to extend matches. In some cases, extending the match may require consolidating smaller, previously established matches into one or more larger matches. For example, referring to the example illustrated in FIGS. 3a and 3b wherein fingerprints are selected based on the smallest relative value per cluster, a first match may be identified between fingerprints 412 and 432; a second match may be identified between fingerprints 413 and 433; and, a third match may be identified between fingerprints 414 and 434. Depending on the technique used, expanding one of these matches may result in consolidation of two or more matches. In this example, the match may be extended resulting in the matching substring "the_soul_of_".

In some cases, the efficiency and/or reliability of finding matches using some fingerprinting techniques may be improved by using the current invention in conjunction with additional optional techniques such as extending matches. For example, referring to the example illustrated in FIGS. 3a and 3b wherein fingerprints are selected based on the largest relative value per cluster, a single match may be identified between fingerprints 411 and 431 (both with a fingerprint value of 0.50935). These fingerprints de-reference to the same subset ("the_"). A variety of techniques may be used to expand the match to cover an extended match "the_soul_of_". For example, in some cases, the match may be expanded by looking at adjacent fingerprints and/or shingles.

The process continues when a compression operation is executed on the input dataset (Step 140). For example, a token referencing a dictionary, cache or history may be used to replace a subset of the input dataset. For example, a compression operation may be executed on the input dataset based on matches between a subset of the input dataset and a subset of data in a second selectively fingerprinted dataset. However, in some cases, a compression operation may be executed on the input dataset based on matches between fingerprint matches. In some cases, fingerprint value may be used as a token and/or used to generate a token. For example, in a case where the fingerprinting process generates unique fingerprints, fingerprint matches may or may not be de-referenced to identify their related shingles before the compression operation is executed. The current invention may be used in conjunction with conventional and non-conventional compression techniques.

Optionally, in some examples according to the current invention, information associated with unmatched shingles from the input dataset may be incorporated into the second selectively fingerprinted dataset (Step 150).

The current invention may be used in a variety of applications such as, but not limited to, the minimization or reduction of network bandwidth usage. According to an example after the current invention, the input dataset may comprise a continuous stream of network traffic. In this example, the input datastream is a stream of bytes which may or may not be arranged in packets. The shingle size may be selected based on the smallest match of interest. For a networking application, very small matches may not be of interest due to compression overhead. In some cases, the shingle size selection may be based, in part, on the overhead associated with the selected compression methodology. In a networking example, the cluster size may be optimized based on performance goals related to acceptable delay times. For example, with some low bandwidth links, the configuration based on performance goals may reflect a willingness to accept delays incurred with compression processing in exchange for better compression ratios; in this case, a small cluster size may be configured. Alternately, with some high bandwidth links or applications which do not tolerate delays, a configuration based on performance goals may reflect a willingness to accept lower compression ratios in exchange for reduced delays; in this case, a large cluster size may be configured. In some cases, the cluster size may be adaptively configurable based on a variety of parameters such as, but not limited to: network traffic load, bandwidth availability, network link quality, bandwidth cost, packet loss statistics and the availability of local computing resources. For this application, the overlap between subsequent shingles may be kept large; for example, with byte sized input data stream elements, the overlap may be configured to the size of a shingle minus a single byte. In this configuration, the compression is alignment independent. In this example, fingerprints may be calculated using a hash function. With the possibility of hash table collisions and the requirement of lossless compression, many networking application configurations will confirm exact matches.

Figure 4:
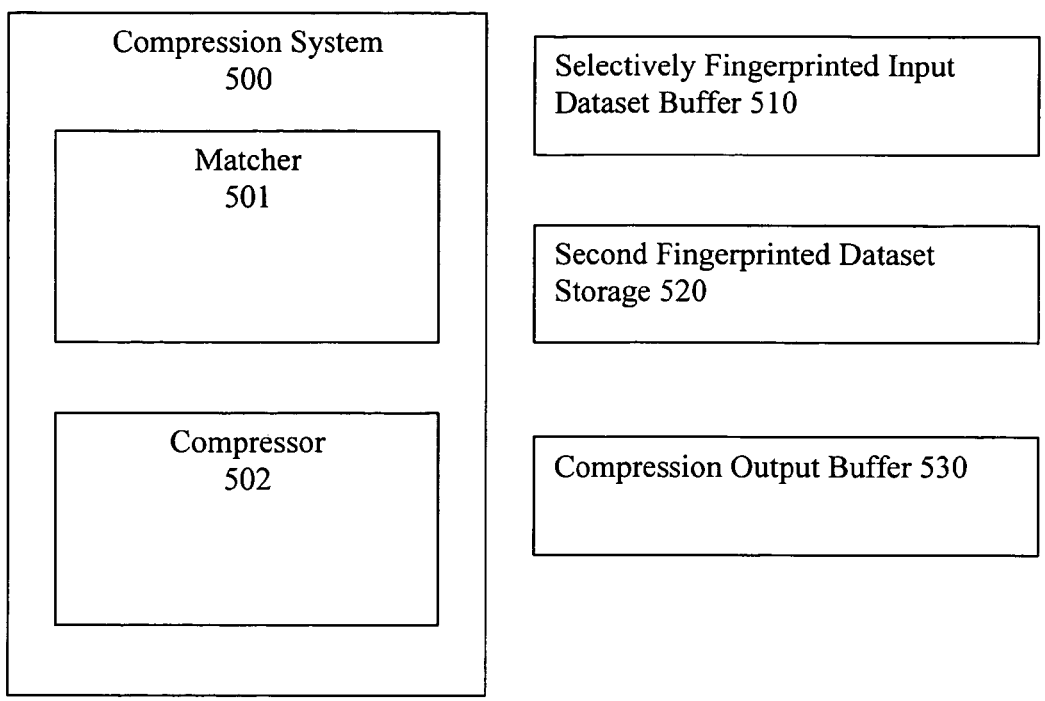
FIG. 4 illustrates an example of a compression system according to the current invention.

In some cases, the current invention may be implemented in software, firmware and/or hardware. FIG. 4 illustrates an example of a compression system 500 according to the current invention. In this example, selectively fingerprinted input dataset buffer 510 may hold characteristic fingerprints associated with an input dataset. In this example, compression processor 500 may access selectively fingerprinted input dataset buffer 510 to access a set of associated characteristic input fingerprints. Second fingerprinted dataset storage 520 may store some or all of a second fingerprinted dataset such as, but not limited to, a history. Matcher 501 may access second fingerprinted dataset storage 520 and search for matches between fingerprints in buffer 510 and fingerprints in storage 520. Compressor 502 may access matches found by matcher 501 and subsequently execute compression operations, emitting compression related data. In this example, compression related data is output to compression output buffer 530.

In some cases, compression system 500 may be implemented wholly or in part as one or more custom or commercially available integrated circuits (ICs), Application Specific Integrated Circuits (ASICs), and/or Field Programmable Gate Arrays (FPGAs). For example, it is envisioned that compression apparatus 500 may be implemented in software, firmware and/or hardware and used in a variety of devices such as, but not limited to, a networking device, a data compression appliance and/or a back-up system. Depending on the configuration, buffers and storage external to the current invention such as 510, 520 and/or 530 may be co-located with the compression system in the same chip, assembly, device or system; in other configurations, one or more of the buffers and/or storage elements 510, 520 and/or 530 may be coupled to the compression system 500 via intermittent or persistent connections such as, but not limited to, a network. For example, in some cases, the input to compression apparatus 500 may comprise a network feed and the input datasets may comprise a stream of information such as, but not limited to packets. In some cases, when the input datasets comprise networking traffic, an adaptively configurable embodiment according to the current invention may alter its configuration based on network traffic related conditions. For example, some configuration parameters such as, but not limited to: the shingle size and/or configuration, the size of the overlap between successive shingles, the number of fingerprints selected per cluster and/or the cluster size, may be adaptively configurable for the input dataset and/or the second selectively fingerprinted dataset based on one or more criteria such as, but not limited to: network traffic load, quality of service (QoS) parameters, destination address and/or bandwidth cost.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks, and that networks may be wired, wireless, or a combination of wired and wireless. Other variations and embodiments are possible in light of above teachings, and it is thus intended that the scope of invention not be limited by this Detailed Description, but rather by Claims following.

We claim:

1. A method for compressing an input dataset comprising the steps of:

selectively fingerprinting the input dataset, the step of selectively fingerprinting comprising the steps of:

fingerprinting shingles of the input dataset wherein shingles comprise overlapping subsets of the input dataset; and, selecting at least one characteristic input fingerprint per cluster based on the value of the fingerprint, thereby creating a set of characteristic input fingerprints;

identifying a candidate subset of the input dataset that is a match with a target subset of data in a second selectively fingerprinted dataset by searching for fingerprint matches between one or more input fingerprints from the set of characteristic input fingerprints and fingerprints associated with the second selectively fingerprinted dataset; and, performing a compression operation on the input dataset.

2. The method of claim 1 wherein the step of identifying a candidate subset of the input dataset that is a match further comprises the step of:

identifying fingerprint matches that correspond to exact matches between the candidate subset and the target subset; and, wherein:
the step of performing a compression operation on the input dataset based on matches comprises the step of performing a compression operation on the input dataset based on exact matches.

3. The method of claim 1 wherein the step of performing a compression operation on the input dataset comprises the step of:
performing a compression operation on the input dataset based on fingerprint matches.

4. The method of claim 1 wherein the step of performing a compression operation on the input dataset comprises the step of:
performing a compression operation on the input dataset based on matches between a subset of the input dataset and a subset of data in a second selectively fingerprinted dataset.

5. The method of claim 1 further comprising the step of extending the size of a match by comparing input dataset elements outside of the candidate subset to dataset elements outside of the target subset in the second selectively fingerprinted dataset.

6. The method of claim 1 further comprising the step of extending the size of a match by comparing fingerprints adjacent to the fingerprint matches.

7. The method of claim 1 wherein the cluster size associated with the step of selectively fingerprinting the input dataset is consistent across the input dataset.

8. The method of claim 1 wherein the cluster size associated with the step of selectively fingerprinting the input dataset changes across the input dataset.

9. The method of claim 1 wherein the second selectively fingerprinted dataset was generated according to the same cluster size as the cluster size associated with the step of selectively fingerprinting the input dataset.

10. The method of claim 1 wherein the second selectively fingerprinted dataset was generated according to a cluster size different from the cluster size associated with the step of selectively fingerprinting the input dataset.

11. The method of claim 1 wherein the step of selecting at least one representative input fingerprint from each cluster comprises the step of:
selecting at least one characteristic input fingerprint per cluster based on the relative value of the fingerprint.

12. The method of claim 1 wherein the step of selecting at least one representative input fingerprint from each cluster comprises selecting the fingerprint with the largest value.

13. The method of claim 1 wherein the step of selecting at least one representative input fingerprint from each cluster comprises selecting the fingerprint with the smallest value.

14. The method of claim 1 wherein the step of selectively fingerprinting comprises creating fingerprints using a hashing function and wherein the fingerprints comprise hash values associated with a hash table.

15. The method of claim 1 wherein the step of selectively fingerprinting comprises creating fingerprints wherein the fingerprint comprises an index into a structure wherein the structure is selected from the list of: associative arrays, tables, trees and databases.

16. The method of claim 1 further comprising the step of adding one or more representative input fingerprints to the second selectively fingerprinted dataset, thereby creating a history and enabling improved compression for subsequent operations.

17. The method of claim 1 wherein a selective fingerprinting parameter may be adaptively configured wherein the selective fingerprinting parameter is selected from the list of: the size of a shingle, the configuration of a shingle, the size of the overlap between successive shingles, the configuration of the overlap between successive shingles, the number of fingerprints selected per cluster and the size of the cluster.

18. A system for compressing an input dataset comprising:
a matcher for selectively fingerprinting the input dataset by:
fingerprinting shingles of the input dataset wherein shingles comprise overlapping subsets of the input dataset;
selecting at least one characteristic input fingerprint per cluster based on the value of the fingerprint, thereby creating a set of characteristic input fingerprints; and,
identifying a candidate subset of the input dataset that is a match with a target subset of data in a second selectively fingerprinted dataset by searching for fingerprint matches between one or more input fingerprints from the set of characteristic input fingerprints and fingerprints associated with the second selectively fingerprinted dataset; and,
a compressor for performing a compression operations on the input dataset, thereby creating a compressed input dataset.

19. The system of claim 18 wherein the matcher selects characteristic input fingerprints per cluster based on the relative value of the fingerprint.

20. The system of claim 18 wherein the system is coupled to an input for receiving an input dataset comprising network traffic.

21. The system of claim 18 wherein the system is coupled to an output for transmitting a compressed input dataset comprising network traffic.

22. The system of claim 18 wherein the matcher is adaptively configurable.

* * * * *

UNITED STATES PATENT AND TRADEMARK OFFICE
CERTIFICATE OF CORRECTION

PATENT NO. : 7,098,815 B1  Page 1 of 1
APPLICATION NO. : 11/089844
DATED : August 29, 2006
INVENTOR(S) : Allen Samuels, Paul Sutter and Robert Plamondon It is certified that error appears in the above-identified patent and that said Letters Patent is hereby corrected as shown below:

In claim 1 (line 9), delete "the value" and insert
-- a value --.

In claim 18 (line 9), delete "the value" and insert
-- a value --.

In claim 18 (line 18), delete "compression operations" and insert
-- compression operation --.

Signed and Sealed this

Second Day of October, 2007

JON W. DUDAS
*Director of the United States Patent and Trademark Office*